(12) United States Patent
Hieno et al.

(10) Patent No.: US 9,291,908 B2
(45) Date of Patent: Mar. 22, 2016

(54) METHOD OF FORMING PATTERN AND LAMINATE

(71) Applicant: KABUSHIKI KAISHA TOSHIBA, Tokyo (JP)

(72) Inventors: Atsushi Hieno, Kawasaki (JP); Shigeki Hattori, Yokohama (JP); Hiroko Nakamura, Yokohama (JP); Satoshi Mikoshiba, Yamato (JP); Koji Asakawa, Kawasaki (JP); Masahiro Kanno, Yokohama (JP); Yuriko Seino, Yokohama (JP); Tsukasa Azuma, Kawasaki (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 14/726,780

(22) Filed: Jun. 1, 2015

(65) Prior Publication Data

US 2015/0261092 A1 Sep. 17, 2015

Related U.S. Application Data

(62) Division of application No. 13/626,415, filed on Sep. 25, 2012, now Pat. No. 9,073,284.

(30) Foreign Application Priority Data

Sep. 26, 2011 (JP) ................. 2011-209850

(51) Int. Cl.
G03F 7/20 (2006.01)
G03F 7/40 (2006.01)
(Continued)

(52) U.S. Cl.
CPC ... *G03F 7/40* (2013.01); *B32B 7/04* (2013.01); *B82Y 30/00* (2013.01); *G03F 7/004* (2013.01);
(Continued)

(58) Field of Classification Search
CPC ......... B32B 7/04; G03F 7/004; G03F 7/0751; G03F 7/0752; G03F 7/11; G03F 7/165; G03F 7/20; G03F 7/40
See application file for complete search history.

(56) References Cited

U.S. PATENT DOCUMENTS 7,790,350 B2 9/2010 Breyta et al.
2009/0035668 A1 2/2009 Breyta et al.
(Continued)

FOREIGN PATENT DOCUMENTS

JP 2008-96596 4/2008

OTHER PUBLICATIONS

G. K. Raghuraman, et al., "Attachment of Polymer Films to Solid Surfaces via Thermal Activation of Self-assembled Monolayers Containing Sulphonyl Azide Group", Langmuir Article, pubs.acs.org/Langmuir, Langmuir 2010, 26(2), pp. 769-774.
Office Action issued Jun. 17, 2014 in Japanese Patent Application No. 2011-209850 (with English language translation).
(Continued)

*Primary Examiner* — Brittany Raymond
(74) *Attorney, Agent, or Firm* — Oblon, McClelland, Maier & Neustadt, L.L.P.

(57) ABSTRACT

According to one embodiment, there is provided a method of forming a pattern, including forming a thermally crosslinkable molecule layer including a thermally crosslinkable molecule on a substrate, forming a photosensitive composition layer including a photosensitive composition on the thermally crosslinkable molecule layer, chemically binding the thermally crosslinkable molecule to the photosensitive composition by heating, selectively irradiating the photosensitive composition layer with energy rays, forming a block copolymer layer including a block copolymer on the photosensitive composition layer, and forming a microphase-separated structure in the block copolymer layer.

16 Claims, 4 Drawing Sheets

(51) Int. Cl.
  *B32B 7/04* (2006.01)
  *B82Y 30/00* (2011.01)
  *G03F 7/004* (2006.01)
  *G03F 7/075* (2006.01)
  *G03F 7/11* (2006.01)
  *G03F 7/16* (2006.01)

(52) U.S. Cl.
  CPC ............ *G03F 7/0751* (2013.01); *G03F 7/0752* (2013.01); *G03F 7/11* (2013.01); *G03F 7/165* (2013.01); *G03F 7/20* (2013.01); *B32B 2307/40* (2013.01)

(56) References Cited

U.S. PATENT DOCUMENTS

| | | |
|---|---|---|
| 2010/0075116 A1 | 3/2010 | Russell et al. |
| 2011/0039061 A1 | 2/2011 | Fedynyshyn et al. |
| 2012/0238109 A1 | 9/2012 | Hattori et al. |
| 2013/0078570 A1 | 3/2013 | Hieno et al. |
| 2014/0127910 A1 | 5/2014 | Hieno et al. |

OTHER PUBLICATIONS

Erik W. Edwards, et al., "Precise Control over Molecular Dimensions of Block-Copolymer Domains Using the Interfacial Energy of Chemically Nanopatterned Substrates", Advanced Materials, vol. 16, No. 15, Aug. 4, 2004, 5 pages.

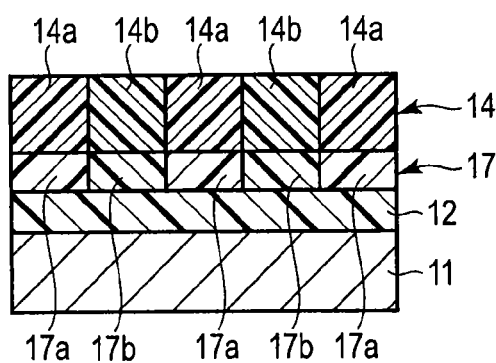
FIG. 1E
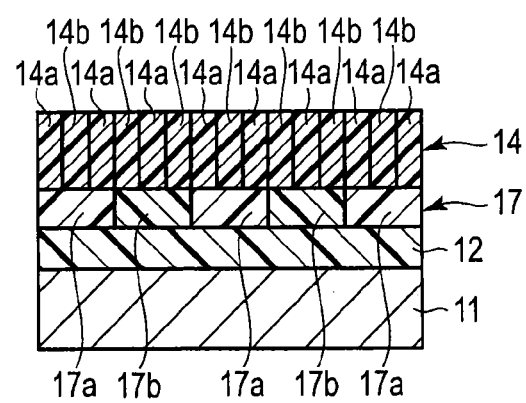
FIG. 1E1
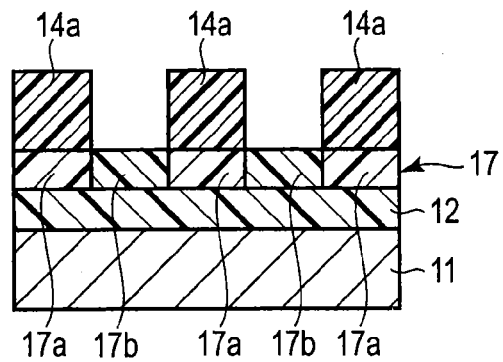
FIG. 1F
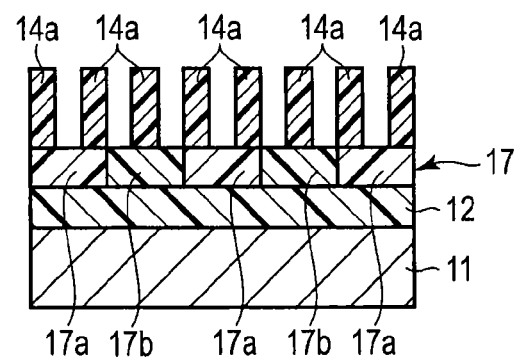
FIG. 1F1

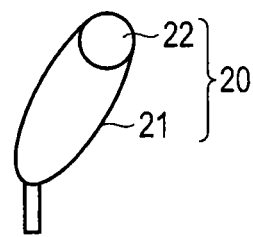
F I G. 2
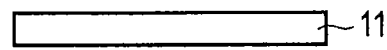
F I G. 3A
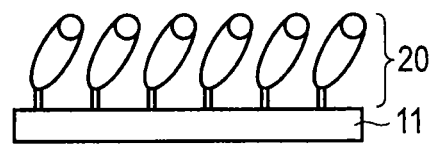
F I G. 3B
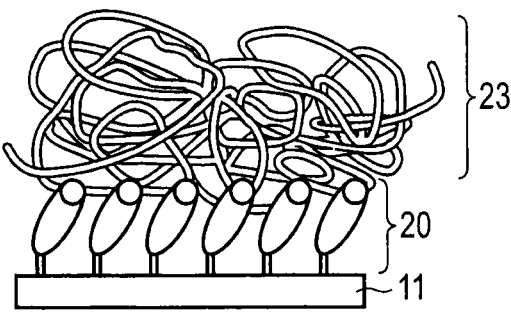
F I G. 3C

METHOD OF FORMING PATTERN AND LAMINATE

CROSS-REFERENCE TO RELATED APPLICATIONS

This application is a division of U.S. application Ser. No. 13/626,415, filed Sep. 25, 2012, now allowed, which is based upon and claims the benefit of priority from Japanese Patent Application No. 2011-209850, filed Sep. 26, 2011, the entire contents of which are incorporated herein by reference.

FIELD

Embodiments described herein relate generally to a method of forming a pattern and a laminate.

BACKGROUND

Microprocessing technology by lithography has been adopted for processes of manufacturing various electronic devices such as semiconductor devices including Large Scale Integrations (LSIs). Still finer microprocessing will be required in the future and attempts are being made to make the wavelength of light used in lithography shorter and to achieve higher performance of resist. However, it is becoming increasingly more difficult to improve the resolution by the above measures.

Further, it becomes a problem that costs are increased by being required finer patterns. Currently, an expensive device such as an extreme ultraviolet (EUV) exposure device and an ArF liquid immersion exposure device are generally used to form finer patterns. The EUV exposure device used in industrial application generally uses light having an exposure wavelength of 13.5 nm. The ArF liquid immersion exposure device uses excimer laser having a wavelength of 193 nm and a high numerical aperture obtained by pouring water between a lens and a wafer. However, particularly in the EUV exposure device, the cost of the device itself and running costs of the device are high. Thus, the cost of forming a pattern is greatly increased. Therefore, a technique which can form fine patterns at low cost is required.

Directed Self-Assembly Lithography (DSAL) is becoming a focus of attention as a fine processing technology independent of light wavelength. Generally, DSAL is a fine processing technology using a pattern formed by using microphase separation of a block copolymer. In DSAL, it is necessary to form a microphase-separated structure in which block copolymers are regularly arranged, and it is desirable to easily control the orientation of block copolymers. From the viewpoint of practicality, it is required that a fine pattern can be formed in a shorter time.

BRIEF DESCRIPTION OF THE DRAWINGS

FIGS. 1A to 1F, 1E1 and 1F1 are cross-sectional views for explaining a method of forming a pattern according to a first embodiment;

FIG. 2 is a schematic diagram showing a structure of a thermally crosslinkable molecule;

FIGS. 3A to 3C are schematic diagrams showing a state of a reaction of a thermally crosslinkable molecule and a photosensitive composition.

DETAILED DESCRIPTION

Figure 1A:
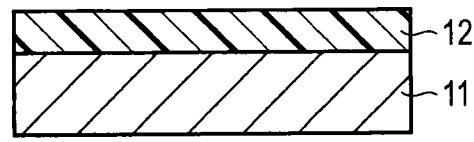

In general, according to one embodiment, there is provided a method of forming a pattern, including: forming a thermally crosslinkable molecule layer including a thermally crosslinkable molecule on a substrate; forming a photosensitive composition layer including a photosensitive composition on the thermally crosslinkable molecule layer; chemically binding the thermally crosslinkable molecule to the photosensitive composition by heating; selectively irradiating the photosensitive composition layer with energy rays; forming a block copolymer layer including a block copolymer on the photosensitive composition layer; and forming a microphase-separated structure in the block copolymer layer. The thermally crosslinkable molecule has a group that attaches to the substrate and a group that chemically binds to another material by heating. The photosensitive composition layer has a surface energy which is changed by irradiation with energy rays.

Embodiments will be described below with reference to drawings.

The block copolymer to be used for Directed Self-Assembly Lithography (DSAL) is constituted of a plurality of block chains in which identical monomers are continuously bound. Block chains are bound to each other by a chemical bond. That is, the block chain is a polymer chain including two or more repeating unit and all of the repeating units included in one of the block chain are identical each other. A fine pattern is formed by microphase-separation of the block copolymer using a repulsive force between the polymers. The morphology of a microphase-separated structure of the block copolymer such as a lamellar phase or cylinder phase is determined by a composition of the block copolymer. For example, in the case of the block copolymer constituted of two types of block chains (first and second block chains), the ratio of two block chains as to form the lamellar pattern is about 50%, respectively. And the ratio of two block chains as to form the cylindrical pattern is about 30% and about 70%, respectively. In the case of the lamellar pattern, a layer of the first block chain and a layer of the second block chain are alternately stacked. On the other hand, in the case of the cylindrical pattern, the block chain contained with lower ratio forms cylinders and the cylinders are regularly arranged. While, the block chain contained with higher ratio forms a matrix around the cylinders.

In the DSAL, block copolymers need to be regularly orientated. In this circumstance, a method to be described below has been suggested.

As an example, a method including: irradiating a self-assembled monolayer (SAM) formed on a substrate with high energy rays such as X-rays and electron-beams; controlling the surface energy of the self-assembled monolayer by modifying a chemical structure of the self-assembled monolayer; and forming a microphase-separated structure of block copolymer on the self-assembled monolayer has been reported. However, when the method is used, the chemical potential of a molecule which constitutes the self-assembled monolayer is limited. Accordingly, the controllability of the surface energy of the self-assembled monolayer becomes poor and thus it becomes difficult to control the orientation of block copolymers.

On the other hand, a method of using a monolayer formed by binding the end of a polymer to a substrate by a chemical reaction, which is called a polymer brush, has been known. The polymer brush is formed on the substrate, electron-beam resist is applied on the substrate, and a resist pattern is formed by lithography. The resist pattern is transferred to the polymer brush by using the resist pattern as a mask, the substrate is irradiated with oxygen plasma, and the resist is removed. Then, the block copolymer layer is formed on the patternized polymer brush and the block copolymer is orientated. However, in this method, it is necessary that a hydroxyl group at the end of polymer chemically reacts with the surface of a silicon substrate sufficiently during forming the polymer brush. It is necessary that the hydroxyl group is sufficiently diffused near the silicon at a temperature which does not decompose the polymer and that a thermal energy enough to exceed activation energy of the polymer is given. Thus, prolonged heat-treatment is required.

Further, a method including: polymerizing a monomer having an group which is eliminated by acid on a substrate to form a polymer brush; applying a photoresist containing a photo-acid generator (PAG) on the polymer brush; irradiating the photoresist with energy rays to generate acid from PAG; and changing the surface energy of the polymer brush by thermal diffusion of acid to the polymer brush has been reported. The method is excellent in controlling the surface energy, but it takes a long time because the rate of polymerization to form the polymer brush is rate-limiting. Therefore, the method using the polymer brush as a lower layer for DSAL is not practical as a fine processing technology for semiconductor devices.

Thus, the embodiment provides a method of forming a pattern using a microphase separation of a block copolymer, wherein the method can easily control the orientation of block copolymers and can form a fine pattern in a short time.

<First Embodiment>

FIGS. 1A to 1F, 1E1 and 1F1 are cross-sectional views for explaining a method of forming a pattern according to a first embodiment. The outline of the method of forming a pattern according to the first embodiment will be described with reference to FIGS. 1A to 1F.

First, a thermally crosslinkable molecule layer 12 is formed by applying a liquid containing a thermally crosslinkable molecule on a substrate 11 (FIG. 1A). The thermally crosslinkable molecule included in the thermally crosslinkable molecule layer 12 is bound to the substrate 11 and is chemically bound to a photosensitive composition included in a photosensitive composition layer 17 to be formed on the thermally crosslinkable molecule layer 12 by heating. Therefore, as shown in FIG. 2, the thermally crosslinkable molecule 20 has a group 21 that attaches to a substrate 11 and a group 22 that chemically binds to another material (herein the photosensitive composition) by heating.

Figure 1B:
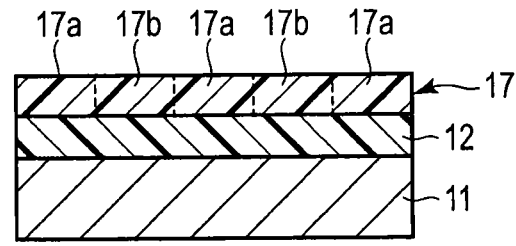

Subsequently, the photosensitive composition layer 17 including a photosensitive composition is formed on the thermally crosslinkable molecule layer 12 (FIG. 1B). The photosensitive composition layer 17 has a surface energy which is changed by irradiation with energy rays. Thereafter, the thermally crosslinkable molecule contained in the thermally crosslinkable molecule layer 12 and the photosensitive composition contained in the photosensitive composition layer 17 are chemically bound by heating.

Figure 1C:
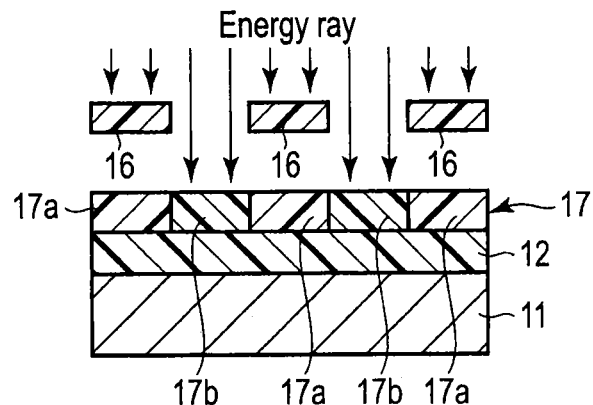

Thereafter, either of the first and second potions 17a, 17b of the photosensitive composition layer 17 is selectively irradiated with energy rays to cause a difference in surface energy between the first and second potions 17a, 17b (FIG. 1C). In FIG. 1C, the first portion 17a is an unexposed portion and the second portion 17b is an exposed portion. The surface energy of the photosensitive composition layer 17 is changed by irradiating with energy rays so that a block copolymer which will be applied on the photosensitive composition layer 17 forms an intended microphase-separated structure. For example, it is conducted by irradiating with energy rays via a mask 16 as shown in FIG. 1C.

Figure 1D:
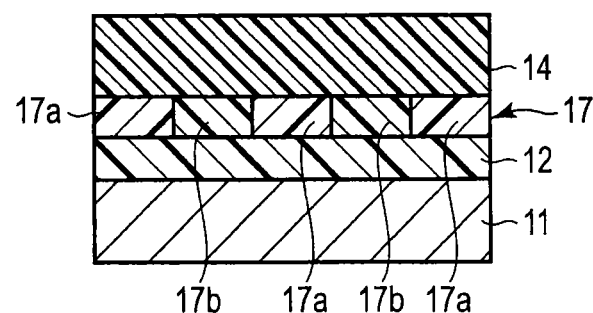

Subsequently, a block copolymer layer 14 is formed on the photosensitive composition layer 17 (FIG. 1D). The block copolymer layer 14 includes a block copolymer containing first and second block chains different from each other.

After the block copolymer layer 14 being formed, microphase-separated structure is formed in the block copolymer layer 14 (FIG. 1E). The forming of the microphase-separated structure can be performed by annealing the block copolymer layer 14 after forming the block copolymer layer 14.

As a result, a first block chain and second block chain are oriented based on the surface energy of the first and second portions 17a, 17b of the photosensitive composition layer 17 to form a microphase-separated pattern 14a, 14b (FIG. 1E).

For example, when the surface energy of the first portion 17a in the photosensitive composition layer 17 is close to that of the first block chain and the surface energy of the second portion 17b is close to that of the second block chain, a lamellar phase in which the first block chain layer 14a and the second block chain layer 14b are orientated in a direction perpendicular to the surface of the photosensitive composition layer 17 as shown in FIG. 1E.

The term "surface energy" used herein means the Gibbs free energy and it can be calculated from the surface tension. The surface tension is the Gibbs free energy per unit area of the surface of a substance. As the surface energies of substances are closer to each other, the affinity of these substances is higher.

According to the above embodiment, it is possible to orient the block copolymers depending on the surface energy of the photosensitive composition layer 17 by forming the photosensitive composition layer 17 on the substrate 11 via the thermally crosslinkable molecule layer 12. The orientation of block copolymers can be easily controlled because the polymer included in the photosensitive composition layer 17 can be selected depending on the block copolymer to be used.

According to the above embodiment, the pattern can be formed in a shorter time. The reason is that the photosensitive composition included in the photosensitive composition layer 17 has many sites which binds chemically with the thermally crosslinkable molecule, and thus the chemical bond is formed immediately and the photosensitive composition contained in the photosensitive composition layer 17 and the thermally crosslinkable molecule contained in the thermally crosslinkable molecule layer 12 can be bound in a short time. Another reason is that the thermally crosslinkable molecule is easily bound to the substrate 11.

A state of a reaction of a thermally crosslinkable molecule and a photosensitive composition is shown schematically in FIGS. 3A to 3C. The substrate 11 is indicated in FIG. 3A. The thermally crosslinkable molecule 20 is adsorbed on the substrate 11 as shown in FIG. 3B. As described above, this adsorption can be conducted in short time. Furthermore, chemical bonds between the thermally crosslinkable molecule and the photosensitive composition are formed as shown in FIG. 3C. As described above, this chemical bond can be formed in short time.

Each process and each member of the method of forming a pattern described above will be described in more detail with reference to FIGS. 1A to 1F, 1E1 and 1F1.

Any substrate used in a semiconductor device can be used as the substrate 11. Examples of such a substrate include a silicon wafer, a doped silicon wafer, a silicon wafer having an insulating layer and a metal layer to be an electrode or a wire on the surface thereof, a mask blank, and a III-V compound semiconductor wafer such as GaAs and AlGaAs. Other examples of the substrate include a chrome or chrome oxide evaporated substrate, an aluminum evaporated substrate, a borone phosphosilicate glass (BPSG), a spin-on glass (SOG) coated substrate, and an SiN coated substrate. For a practical purpose, a circuit board obtained by processing a substrate is preferred.

To remove organic impurities adhered to the surface of the substrate 11, it is preferable to perform pre-processing such as irradiation of the substrate 11 with ultraviolet rays or treatment by acid before applying the thermally crosslinkable molecule.

The thermally crosslinkable molecule is applied to the substrate 11 to form the thermally crosslinkable molecule layer 12 (FIG. 1A).

In view of fabricating a semiconductor devices, the thermally crosslinkable molecule included in the thermally crosslinkable molecule layer 12 is preferably a material which easily reacts with a surface of metal and metal oxide on a silicon substrate. As such a thermally crosslinkable molecule, it is exemplified a molecule having a silanol group, an alkoxy silyl group, a chlorosilyl group, a phosphonate group, a selenide group, a telluride group, a sulfide group, a disulfide group, a thiol group, an isocyanate group, a bromide group, a carbonyl group, or a hydroxyl group as an end.

The thermally crosslinkable molecule forms a chemical bond by heating with the photosensitive composition included in the photosensitive composition layer 17 which is stacked thereon and serves to fix the photosensitive composition layer 17 to the substrate 11. As such a thermally crosslinkable molecule, it is exemplified thermally crosslinkable molecules which have a functional group that easily reacts with the surface of metal or metal oxide at one end and have an azide skeleton at the other end. The azide is decomposed into nitrene by heating and reacted with an alkyl chain of the photosensitive composition included in the photosensitive composition layer 17. When the alkyl chain of the photosensitive composition includes a tertiary carbon, the reaction is most likely caused. As a result, the photosensitive composition layer 17 is fixed on the thermally crosslinkable molecule layer 12.

Example of the compound which can be used as the thermally crosslinkable molecule will be indicated below. The thermally crosslinkable molecule is preferably one which forms a monolayer. For example, the thermally crosslinkable molecule has the structure represented by a general formula (I) below.

  (I)

wherein

Z represents a silanol group, an alkoxy silyl group, a chlorosilyl group, a phosphonate group, a selenide group, a telluride group, a sulfide group, a disulfide group, a thiol group, an isocyanate group, a bromide group, a carbonyl group or a hydroxyl group;

X represents an alkylene group or a combination group of an alkylene group and an ether linkage;

Y represents an azido group or a benzenesulphonyl azido group.

The alkylene group represented by X may be any of a straight, branched, and cyclic. The length of the alkylene group is not limited. However, from the viewpoint of ease of industrial synthesis, the number of carbon included in the alkylene group is preferably 1 to 12. As described above, from the viewpoint of ease of industrial synthesis, the number of carbon included in the combination group of an alkylene group and an ether linkage is preferably 1 to 12.

Examples of the compound represented by Formula (I) include a thermally crosslinkable silane coupling agent having a sulfonylazide skeleton represented by a general formula (I') below.

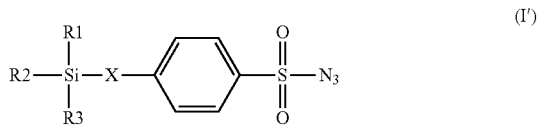

wherein X is defined as in the above general formula (I) and its preferable range is also the same.

At least one of R1, R2, and R3 is selected from the group consisting of Cl, OH, and an alkoxy group. The others of R1, R2, and R3 are selected from the group consisting of H, Cl, OH, an alkoxy group, and an alkyl group. Examples of the alkoxy group include $OCH_3$, $OC_2H_5$, and $OC_3H_7$.

Furthermore, it is preferable that the thermally crosslinkable molecule can be synthesized simply and inexpensively for industrial use. From such a viewpoint, among the compounds represented by the general formula (I), a compound represented by any of general formulae (Ia) to (Ic) below is particularly preferred. In general formulae (Ia) to (Ic), Me represents a methyl group and n represents an integer of 1 to 12. It is preferable that n is in a range of 2 to 8.

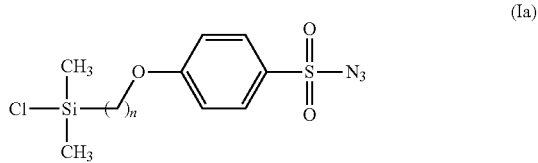

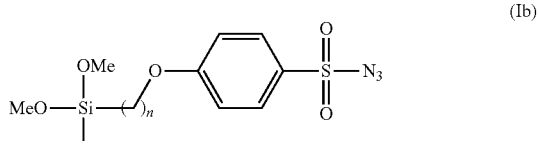

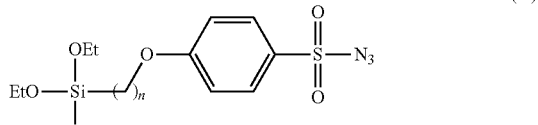

Examples of the compound represented by the general formula (I') include 4-(3'chlorodimethylsilyl)propylbenzenesulfonyl azide, 4-(3'dichloromethylsilyl)propylbenzenesulfonyl azide, 4-(3'trichlorosilyl)propylbenzenesulfonyl azide, 4-(3'chlorodimethylsilyl)propyloxybenzenesulphonyl azide, 4-(3'dichloromethylsilyl)propyloxybenzenesulphonyl azide, 4-(3'trichlorosilyl)propyloxybenzenesulphonyl azide, 4-(3'hydroxydimethylsilyl)propylbenzenesulfonyl azide, 4-(3'dihydroxymethylsilyl)propylbenzenesulfonyl azide, 4-(3'trihydroxysilyl)propylbenzenesulfonyl azide, 4-(3'hydroxydimethylsilyl)propyloxybenzenesulphonyl azide, 4-(3'dihydroxymethylsilyl)propyloxybenzenesulphonyl azide, 4-(3'trihydroxysilyl)propyloxybenzenesulphonyl azide, 4-(3'methoxydimethylsilyl)propylbenzenesulfonyl azide, 4-(3'dimethoxymethylsilyl)propylbenzenesulfonyl azide, 4-(3'trimethoxysilyl)propylbenzenesulfonyl azide, 4-(3'methoxydimethylsilyl)propyloxybenzenesulphonyl azide, 4-(3'dimethoxymethylsilyl)propyloxybenzenesulphonyl azide, 4-(3'trimethoxysilyl)propyloxybenzenesulphonyl azide, 4-(3'ethoxydimethylsilyl)propylbenzenesulfonyl azide, 4-(3'diethoxymethylsilyl)propylbenzenesulfonyl azide, 4-(3'triethoxy silyl)propylbenzenesulfonyl azide, 4-(3'ethoxydimethylsilyl)propyloxybenzenesulphonyl azide, 4-(3'diethoxymethylsilyl)propyloxybenzenesulphonyl azide, 4-(3'triethoxy silyl)propyloxybenzenesulphonyl azide, 4-(3'propyloxydimethylsilyl)propylbenzenesulfonyl azide, 4-(3'dipropyloxymethylsilyl)propylbenzenesulfonyl azide, 4-(3'tripropyloxysilyl)propylbenzenesulfonyl azide, 4-(3'propyloxydimethylsilyl)propyloxybenzenesulphonyl azide, 4-(3'dipropyloxymethylsilyl)propyloxybenzenesulphonyl azide, and 4-(3'tripropyloxylyl)propyloxybenzenesulphonyl azide. Among these compounds, compounds corresponding to the general formulae (Ia) to (Ic) above are especially preferable.

Examples of the compound represented by the general formula (I) include a thermally crosslinkable silane coupling agent having an alkylazide skeleton which is represented by a general formula (II) below.

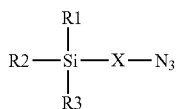
(II)

wherein X is defined as in the above general formula (I) and its preferable range is also the same.

R1, R2, and R3 are defined in the above general formula (I') and their preferable ranges are also the same.

It is preferable that the thermally crosslinkable molecule can be synthesized simply and inexpensively for industrial use. From such a viewpoint, among the compounds represented by the general formula (II), a compound represented by any of general formulae (IIa) to (IIc) below is particularly preferred. In general formulae (IIa) to (IIc), Me represents a methyl group and n represents an integer of 1 to 12. It is preferable that n is in a range of 2 to 8.

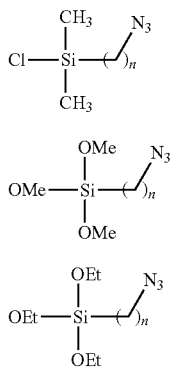
(IIa)
(IIb)
(IIc)

Examples of the compound represented by the general formula (II) include 1-azide-3-propylchlorodimethylsilane, 1-azide-3-propyldichloromethylsilane, 1-azide-3-propyltrichlorosilane, 1-azide-3-propylmethoxydimethylsilane, 1-azide-3-propyldimethoxymethylsilane, 1-azide-3-propyltrimethoxysilane, 1-azide-3-propylethoxydiethylsilane, 1-azide-3-propyldiethoxyethylsilane, 1-azide-3-propyltriethoxysilane, 1-azide-8-octylchlorodimethylsilane, 1-azide-8-octyldichloromethylsilane, 1-azide-8-octyltrichlorosilane, 1-azide-8-octylmethoxydimethylsilane, 1-azide-8-octyldimethoxymethylsilane, 1-azide-8-octyltrimethoxysilane, 1-azide-8-octylethoxydiethylsilane, 1-azide-8-octyldiethoxyethylsilane, and 1-azide-8-octyltriethoxysilane. Among these compounds, compounds corresponding to the general formulae (IIa) to (IIc) above are especially preferable.

As the compound represented by the general formula (I), a thermally crosslinkable thiol coupling agent having a sulfonylazide skeleton which is represented by a general formula (III) can be also exemplified.

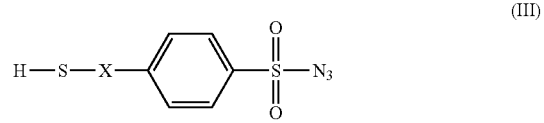
(III)

wherein X is defined as in the above general formula (I) and its preferable range is also the same.

Among the compounds represented by the general formula (III), the compound represented by a general formula (IIIa) below is especially preferable. In general formula (IIIa), n represents an integer of 1 to 12 and preferably an integer of 2 to 8.

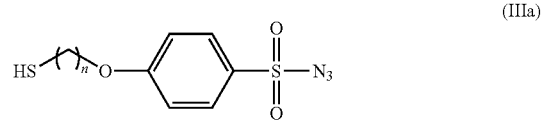
(IIIa)

Examples of the compound represented by the general formula (III) include 4-(ethanethiol) benzenesulphonyl azide, 4-(propanethiol) benzenesulphonyl azide, 4-(butanethiol) benzenesulphonyl azide, 4-(methoxythiol) benzenesulphonyl azide, 4-(ethoxythiol) benzenesulphonyl azide, 4-(propyloxythiol) benzenesulphonyl azide, and 4-(butoxythiol) benzenesulphonyl azide. Among these compounds, compounds corresponding to the general formula (IIIa) above are especially preferable.

Examples of the compound represented by the above general formula (I) include a thermally crosslinkable thiol coupling agent having an alkylazide skeleton which is represented by a general formula (IV) below.

HS—X—N₃    (IV)

wherein X is defined as in the general formula (I) above and its preferable range is also the same.

Among the compounds represented by the general formula (IV), the compound represented by a general formula (IVa) below is especially preferable. In general formula (IVa), n represents an integer of 1 to 12 and preferably an integer of 2 to 8.

(IVa)

Examples of the compound represented by Formula (IV) include
1-azide-1'-ethylenethiol, 1-azide-3-propanethiol, 1-azide-4-butylthiol, 1-azide-5-pentanethiol, 1-azide-6-hexanethiol, 1-azide-7-heptanethiol, 1-azide-8-octanethiol, 1-azide-9-nonanethiol,
1-azide-10-decanethiol, 1-azide-11-undecanethiol, and 1-azide-12-dodecanethiol. Among these compounds, compounds corresponding to the general formula (IVa) above are especially preferable.

Examples of the compound represented by the above Formula (I) include a thermally crosslinkable molecule having a sulfonylazide skeleton and a phosphonate group which is represented by a general formula (V) below.

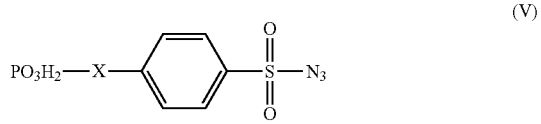

wherein X is defined as in the general formula (I) above and its preferable range is also the same.

Among the compounds represented by the general formula (V), the compound represented by a general formula (Va) below is especially preferable. In general formula (Va), n represents an integer of 1 to 12 and preferably an integer of 2 to 8.

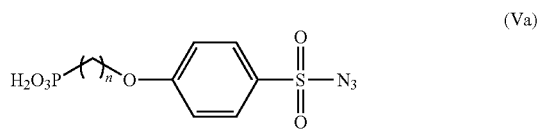

Examples of the compound represented by the general formula (V) include 4-(ethanephosphonate) benzenesulphonyl azide, 4-(propanephosphonate) benzenesulphonyl azide, 4-(butanephosphonate) benzenesulphonyl azide, 4-(methoxyphosphonate) benzenesulphonyl azide, 4-(ethoxyphosphonate) benzenesulphonyl azide, 4-(propyloxyphosphonate) benzenesulphonyl azide, and 4-(butoxyphosphonate) benzenesulphonyl azide. Among these compounds, compounds corresponding to the general formula (Va) above are especially preferable.

Examples of the compound represented by the above Formula (I) include an azide skeleton and a phosphonate group which is represented by a general formula (VI) below.

wherein X is defined as in the general formula (I) above and its preferable range is also the same.

Among the compounds represented by the general formula (VI), the compound represented by a general formula (VIa) below is especially preferable. In general formula (VIa), n represents an integer of 1 to 12 and preferably an integer of 2 to 8.

Examples of the compound represented by the general formula (VI) include 1-azide-1'-ethylene phosphonate, 1-azide-3-propane phosphonate, 1-azide-4-butyl phosphonate, 1-azide-5-pentane phosphonate, 1-azide-6-hexane phosphonate, 1-azide-7-heptane phosphonate, 1-azide-8-octane phosphonate, 1-azide-9-nonane phosphonate, 1-azide-10-decane phosphonate, 1-azide-11-undecane phosphonate, and 1-azide-12-dodecane phosphonate. Among these compounds, compounds corresponding to the general formula (VIa) above are especially preferable.

As the method of forming the thermally crosslinkable molecule layer 12, general coating methods such as spin coating, dip coating, and vapor-phase growth can be used. In the embodiments, the vapor-phase growth is also expressed as the coating process for convenience.

When the spin-coating is used, the substrate 11 is spin-coated with the thermally crosslinkable molecule as a diluted solution with a solvent or as a stock solution and baked on a hot plate or the like if necessary.

The dip coating process includes diluting a thermally crosslinkable molecule with a solvent, and immersing the substrate 11 in the diluted solution for a given length of time to form the thermally crosslinkable molecule layer 12.

When the dip-coating is used, the thermally crosslinkable molecule is diluted with a solvent and a substrate 11 is soaked in the diluted solution to form the thermally crosslinkable molecule layer 12.

When the vapor-phase growth is used, the thermally crosslinkable molecule is changed into a gas state by lowering the pressure, raising the temperature, or doing both and a substrate 11 is introduced thereinto and exposed to the gas for a fixed time to form the thermally crosslinkable molecule layer 12 on the surface of the substrate 11.

In the spin-coating, the concentration of the thermally crosslinkable molecule in the diluted solution is preferably 1 to 30 wt %, but is not limited. It is able to adjust the concentration of the material in accordance with the degree of coating spread with respect to the substrate 11. The solvent to be used is preferably one that does not react with the thermally crosslinkable molecule, though dependent on the thermally crosslinkable molecule. Such solvents include aromatic hydrocarbons such as toluene, xylene, and mesitylene, cycloalkanes such as cyclohexane, cycloheptane, cyclooctane, and cyclononane, alkanes such as hexane, heptane, octane, nonane, and decane, and alkyl alcohols such as methanol, ethanol, 1-propanol, and 2-propanol. In addition to the above solvents, from the viewpoint of reactivity, wettability against the substrate 11, and volatility, organic solvents such as ketones, cellosolves, and esters used as solvents for common photoresists can also be used. Ketones include cyclohexanone, acetone, ethyl methyl ketone, and methyl isobutyl ketone. Cellosolves include methyl cellosolve, methyl cellosolve acetate, ethyl cellosolve acetate, and butyl cellosolve acetate. Esters include ethyl acetate, butyl acetate, isoamyl acetate, γ-butyrolactone, and 3-methoxy methyl propionate. Combination of two or more solvents can be used if necessary. If necessary, a dehydrating solvent can be used from the viewpoint of reactivity with a functional group on the surface of the substrate 11. The temperature when baking on a hot plate is not limited as long as it is a temperature in which the activation energy of the thermally crosslinkable molecule exceeds an energy necessary for chemically binding to the functional group on the surface of the substrate 11 and azide is not thermally decomposed. Preferably, it is from 80 to 150° C.

In the dip-coating, the concentration of the thermally crosslinkable molecule in the diluted solution is preferably 1 to 30 wt %. The solvent to be used is, like the solvent used for spin-coating, preferably one that does not react with the thermally crosslinkable molecule. Such solvents include aromatic hydrocarbons such as toluene, xylene, and mesitylene, cycloalkanes such as cyclohexane, cycloheptane, cyclooctane, and cyclononane, alkanes such as hexane, heptane, octane, nonane, and decane, and alkyl alcohols such as methanol, ethanol, 1-propanol, and 2-propanol. If necessary, a dehydrating solvent can be used from the viewpoint of reactivity with a functional group on the surface of the substrate 11. Although the immersion time depends on the concentration and reactivity, it is preferably from 1 to 60 minutes. From the viewpoint of the reaction rate, the substrate 11 may be immersed in a heated solution. The immersion temperature is set to a temperature that is less than a boiling point of the solvent and does not allow the thermally crosslinkable molecule to be decomposed before the thermally crosslinkable molecule reacts with the functional group of the surface of the substrate 11. Generally, it is adjusted to 40 to 100° C.

Since the thermally crosslinkable molecule layer 12 is preferably a monolayer, it is preferable to rinse an excessive amount of the thermally crosslinkable molecule adsorbed on the substrate 11. As the solvent to be used in this process, it is preferable to use the solvent used for the immersion. It is preferable that the solvent is removed by spraying inert gases such as nitrogen and argon to the portion where the solvent has been applied after the rinsing or the solvent is removed by heating it on a hot plate, if necessary.

In the vapor-phase growth, the pressure is lowered, the temperature is raised, or both are done to change the thermally crosslinkable molecule into a gas state in accordance with vapor pressure characteristics of it. Though dependent on the boiling point of the thermally crosslinkable molecule to be used, it is preferable to raise the temperature until the thermally crosslinkable molecule changes into a gas state by decompression from the viewpoint of stability of the material. It is preferable to insert the substrate 11 into a space in which the thermally crosslinkable molecule in a gas state is present or to insert the substrate 11 in advance to expose the surface of the substrate 11 with the thermally crosslinkable molecule. After the substrate 11 being exposed, the excessive material adsorbed beyond the range of the thermally crosslinkable molecule layer 12 may be washed with a solvent if necessary.

Subsequently, the photosensitive composition layer 17 is formed on the thermally crosslinkable molecule layer 12 (FIG. 1B).

The photosensitive composition included in the photosensitive composition layer 17 is not limited as long as the surface energy is changed by irradiation with energy rays. For example, a mixture of a random copolymer containing a segment having a protective group and the photo-acid generator (PAG) can be used. In this case, acid is generated from PAG by irradiation with energy rays and a protective group of the random copolymer is eliminated, thereby allowing the surface energy of the photosensitive composition layer 17 to be changed.

When the above mixture is used, preferred combinations of polymers constituting the random copolymer are selected from polystyrene (hereinafter also referred to as PS) and poly(tert-butyl methacrylate); polystyrene and poly(tert-butyl acrylate); polymethyl acrylate and poly(tert-butyl methacrylate); and polymethyl acrylate and poly(tert-butyl acrylate). The type and the volume fraction of the photosensitive composition can be changed depending on the block copolymer to be used and the intended microphase-separated pattern of the block copolymer.

The method of forming the photosensitive composition layer 17 on the thermally crosslinkable molecule layer 12 is not limited. For example, spin coating, dip coating, a doctor blade, curtain coating, and other method can be used. The concentration for diluting the photosensitive composition with a solvent is preferably from 0.3 to 30 wt %, however, it is not limited thereto. It is preferable to adjust the concentration depending on a level of the spread of the solvent to the thermally crosslinkable molecule layer 12. Although the solvent to be used depends on the photosensitive composition being used, a solvent that does not react with the photosensitive composition is preferred. Examples of the solvent include aromatic hydrocarbons such as toluene, xylene, and mesitylene; cycloalkanes, such as cyclohexane, cycloheptane, cyclooctane, and cyclononane; alkanes such as hexane, heptane, octane, nonane, and decane; and alkyl alcohols such as methanol, ethanol, 1-propanol, and 2-propanol. In addition to the above solvents, from the viewpoint of reactivity, wettability, and volatility, a general solvent for photoresist such as ketones, cellosolves and esters can be used. Examples of solvents of ketones include cyclohexanone, acetone, ethyl methyl ketone, and methyl isobutyl ketone. Examples of solvents of cellosolves include methyl cellosolve, methyl cellosolve acetate, ethyl cellosolve acetate, and butyl cellosolve acetate. Examples of solvents of esters include ethyl acetate, butyl acetate, isoamyl acetate, γ-butyrolactone, and 3-methoxy methyl propionate. The solvents can be used as a combination of two or more, if necessary. In order not to inhibit the formation of chemical bond between the thermally crosslinkable molecule and the photosensitive composition, it is preferable to use a dehydration solvent.

Thereafter, the layers are heated to form a chemical bond between the thermally crosslinkable molecule included in the thermally crosslinkable molecule layer 12 and the photosensitive composition included in the photosensitive composition layer 17.

The heating temperature for chemically binding the thermally crosslinkable molecule to the photosensitive composition is preferably a temperature that does not cause decomposition of the photosensitive composition. Specifically, it is preferably from 120 to 220° C.

Thereafter, selectively irradiating the photosensitive composition layer with energy rays to form a pattern of an exposed portion 17a and unexposed portion 17b (FIG. 1C).

Exposure of the photosensitive composition layer 17 can be performed by irradiating with energy rays via a mask 16. The energy rays for exposure are not particularly limited as long as they can change the surface energy of the photosensitive composition layer 17. When the photosensitive composition layer 17 includes PAG, energy rays having a wavelength which allows PAG to generate acid are selected for use. Specific examples thereof include ultraviolet rays, i-rays, h-rays or g-rays of a mercury lamp; xenon lamp light, deep ultraviolet light (e.g., an excimer laser light such as KrF or ArF); EUV, X-rays, synchrotron orbital radiation (SR), electron beams, γ-rays, and ion beams. When electron beams or ion beams are used, a pattern may be drawn on the photosensitive composition layer 17 directly.

Control of the surface energy of the photosensitive composition layer 17 is performed by selecting the material constituting the photosensitive composition layer 17, the concentration of PAG, the irradiation with energy rays and the condition of the bake after exposure. The control of the surface energy by energy rays can be performed by covering a region which intends to keep the surface energy low with a mask to partially shield energy rays or changing the irradiation time of the energy rays.

In the embodiment, the photosensitive composition which is not chemically bound to the thermally crosslinkable molecule can be removed from the photosensitive composition layer after binding chemically the thermally crosslinkable molecule to the photosensitive composition and before irradiating the photosensitive composition layer with energy rays. Alternatively, the photosensitive composition which is not chemically bound to the thermally crosslinkable molecule can be removed from the photosensitive composition layer after irradiating the photosensitive composition layer with energy rays and before forming the block copolymer layer.

The block copolymer layer 14 can be more stably formed on the photosensitive composition layer 17 by removing the photosensitive composition which is not chemically bound to the thermally crosslinkable molecule from the photosensitive composition layer 17. Removal of the unreacted photosensitive composition can be performed using a solvent that can wash out the photosensitive composition.

In FIGS. 1C to 1F, 1E1 and 1F1, the thickness of the photosensitive composition layer 17 is the same as that of FIG. 1B in order to simplify the description.

Subsequently, the block copolymer layer 14 is formed on the photosensitive composition layer 17 (FIG. 1D).

It is preferable that the block copolymer included in the block copolymer layer 14 has the composition in which the first block chain and the second block chain form a lamellar or cylindrical phase when microphase-separation is caused. It is more preferable that one of the block chains can be removed from the microphase-separated structure. Examples of the polymer constituting the block copolymer include polystyrenes such as polystyrene and poly(α-methylstyrene); polymethacrylates such as polymethylmethacrylate, poly(n-propyl methacrylate), poly(n-butyl methacrylate), poly(n-hexyl methacrylate); polyhedral oligomeric silsesquioxane; polydimethylsiloxane; polyethylene glycol; polylactic acid; and polyvinylpyridines such as poly(2-vinylpyridine) and poly(4-vinylpyridine). Block copolymers obtained by combining at least two or more types of the above polymers can be used.

In the embodiment, the case where a block copolymer constituted of two types of polymers is used is described. However, it is possible to similarly use a block polymer constituted of three or more types of polymers.

The method of applying block copolymers on the photosensitive composition layer 17 is not limited. For example, the spin-coating, dip-coating, doctor blade method, curtain-coating, and other methods are used. After applying a block copolymer solution, the solvent may be removed by heating the substrate 11 on a hot plate. The heating temperature here is not limited as long as it is a temperature capable of removing the solvent. The heating temperature is preferably 220° C. or less.

After the formation of the block copolymer layer 14, the microphase separation of block copolymers is caused in the block copolymer layer 14 by heating and annealing. As a result, as shown in FIGS. 1E and 1E1, the first block chain and the second block chain are orientated based on surface energies of the unexposed portion 17a and the exposed portion 17b in the photosensitive composition layer 17 and a microphase-separated pattern of the block copolymer is formed.

For forming a microphase-separated pattern of the block copolymers, block copolymers are generally annealed at a temperature equal to the glass transition temperature or higher. However, if the temperature of annealing rises beyond the order-disorder transition temperature (ODT), a disordered structure is built so that no microphase-separated structure can be obtained. Thus, it is preferable to anneal at a temperature of the glass transition temperature or more and the ODT or less. An annealing device is not limited. Preferably, an oven, a hot plate or the like is used.

The atmosphere during annealing is not limited. It is preferable to perform annealing under atmosphere of an inert gas such as argon or nitrogen from the viewpoint of preventing decomposition of block copolymers. Annealing may also be performed under an atmosphere of a gas which can cause a reducing reaction such as hydrogen mixed with an inert gas, if necessary.

After forming the microphase-separated structure in the block copolymer layer 14 as described above, one of phases constituting the microphase-separated structure (here, a layer of second block copolymer chains 14b) can be removed selectively (FIGS. 1F and 1F1). A remained phase (here, a layer of first block copolymer chains 14a) can be used as an etching mask to form a line and space pattern or a contact hole pattern. The pattern formed by the block copolymer which have not been removed can be used as a mask pattern to etch an underlayer, that is, the substrate 11 itself or a metal layer or insulating layer formed on the substrate 11. Furthermore, the remained phase can be used as a transfer film.

As the method of removing one of the block chains after forming the microphase-separated structure, reactive ion etching (RIE) and wet etching are exemplified. According to RIE, one of the block chains can be removed by utilizing the fact that the first and second block chains have different reactive ion etching resistance. For example, when the microphase-separated structure is formed by using a block copolymer constituted of polystyrene and polybutadiene, only a polystyrene block can be left by an ozone process. When the microphase-separated structure is formed by using a block copolymer constituted of polystyrene and polymethylmethacrylate, only the polystyrene block can be left by reactive ion etching using reactive gases such as $O_2$ and $CF_4$ (see K. Asakawa et al., Jpn. J. Appl. Phys, 41, 6112-6118, 2002).

When the wet etching are used, the microphase-separated structure of the block copolymers including the first block chains which are decomposed by irradiation with energy rays and the second block chains which are not decomposed by the energy rays easily is formed, the first block chains are decomposed by irradiating the block copolymer layer with light or electron beams, and the first block chains are washed away with solvent to remove the first block chains selectively.

In the first embodiment, the size and pattern of the microphase-separated structure can be changed by adjusting the molecular weight and the component ratio of block copolymer. Therefore, as shown in FIG. 1E1, it is also possible to obtain the microphase-separated pattern which is finer than the pattern formed by irradiation the surface of the photosensitive composition layer 17 with energy rays. As a result, as shown in FIG. 1F1, a fine line and space pattern or a contact hole pattern which exceeds the resolution of energy rays used for irradiation to the photosensitive composition layer 17 can be formed.

According to the first embodiment, it is possible to easily control the orientation of block copolymers and form a pattern on the substrate in a short time. In the first embodiment, a plurality of portions having the surface energy different from each other can be formed on the photosensitive composition layer 17 without using the resist which is generally used to form a guide pattern for DSAL. As a result, the guide pattern for DSAL can be formed more simply. When the guide pattern for DSAL is formed using the resist, it is necessary to remove either the exposed portion or the unexposed portion after irradiating with energy rays and transfer the pattern by etching. However, when the pattern is formed using the photosensitive composition, the layer is just rinsed after irradiating with energy rays. Thus, the above process can be shortened.

Additionally, the thickness of the photosensitive composition layer 17 is much thinner than that of the resist. Thus, when the photosensitive composition is irradiated with energy rays, the depth of focus becomes shallower and the resolution is improved as compared with the case where the resist is irradiated. The film thickness of the photosensitive composition layer 17 is preferably greater than 1 nm and smaller than 10 nm. This is because if the film thickness is 1 nm or less, the surface energy state becomes unstable. On the other hand, if the film thickness is 10 nm or more, an aspect ratio of pattern after etching the block copolymer layer 14 and the photosensitive composition layer 17 becomes smaller and there is possibility not to function as a transfer film. The film thickness of the photosensitive composition layer 17 is more preferably from 2 to 10 nm, particularly preferably from 2 to 5 nm.

According to the further embodiment, there is provided a laminate shown in FIG. 1B. The laminate shown in FIG. 1B including a substrate; a thermally crosslinkable molecule layer which is stacked on the substrate and includes a thermally crosslinkable molecule with a group that attaches to the substrate and a group that chemically binds to another material by heating; a photosensitive composition layer which is stacked and chemically bonded on the thermally crosslinkable molecule layer, includes a photosensitive composition, has a surface energy which is changed by irradiation with energy rays and forms crosslinking with crosslinkable molecule thermally. Furthermore, there is provided a laminate further including a block copolymer layer which is stacked on the photosensitive composition layer and includes a block copolymer.

<Second Embodiment>

Subsequently, the second embodiment will be described with reference to FIGS. 4A to 4H. FIGS. 4A to 4H are cross-sectional views for explaining a method of forming a pattern according to a second embodiment.

In the second embodiment, another type of polymer is employed in place of the photosensitive composition in the first embodiment. A method of forming a pattern according to the second embodiment includes forming a patterned layer using a resist on a polymer layer, forming the block copolymer layer on an exposed surface of the polymer layer (i.e. a surface which is not covered with the resist), and forming a microphase-separated structure in the block copolymer layer to form a pattern constituting of first and second block chains. In the second embodiment, the description regarding same members as the first embodiment will be abbreviated.

Figure 4A:
FIGS. 4A to 4H are cross-sectional views for explaining a method of forming a pattern according to a second embodiment.
Figure 4B:
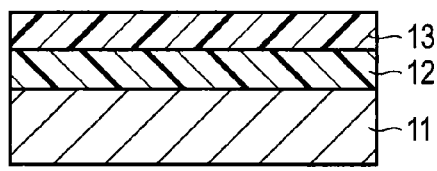
Figure 4C:
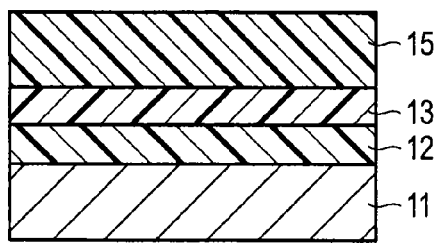
Figure 4D:
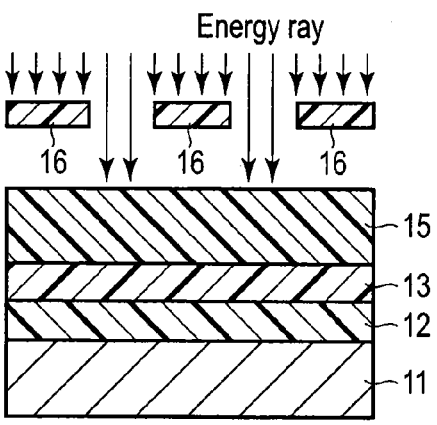
Figure 4E:
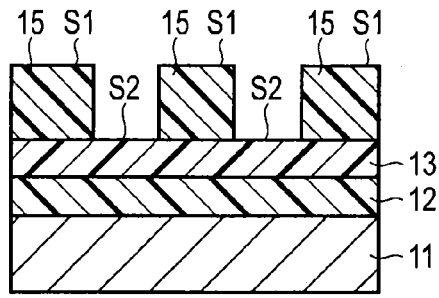
Figure 4F:
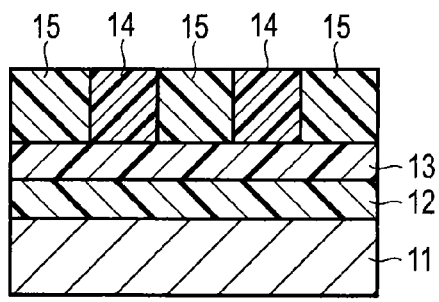

In the second embodiment, the process of forming the thermally crosslinkable molecule layer 12 on the substrate 11 is performed similarly to the first embodiment (FIG. 4A). Thereafter, a polymer layer 13 including a polymer is formed on the thermally crosslinkable molecule layer 12 (FIG. 4B). Here, the polymer included in the polymer layer 13 has no photosensitivity. Then, the thermally crosslinkable molecule is bound chemically to the polymer by heating. Then, a resist is applied on the polymer layer 13 to form a resist layer 15 (FIG. 4C). A portion of the resist layer 15 is selectively irradiated with energy rays via a mask 16 (FIG. 4D), followed by being developed to form a convexoconcave structure (FIG. 4E). The applying of the resist, irradiating of the resist with energy rays, and development of the resist can be performed by a method usually used in the art. The resist used herein is not limited as long as it can be used as resist. For example, a photoresist, electron-beam resist and ion-beam resist can be used.

Figure 4G:
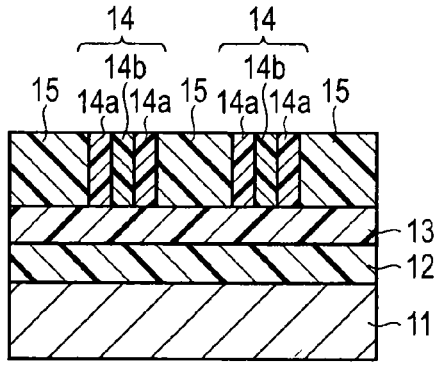

Thereafter, the resist is hardened by annealing and the block copolymer layer 14 containing block copolymers is formed on a crevice S2 of the convexoconcave structure formed by the resist (FIG. 4F) (a crevice S2 is shown in FIG. 4E). The block copolymer herein contains a first block chain and a second block chain which have a characteristic different from each other. The block copolymer to be used and a method of applying the block copolymer are same as those of the first embodiment above. There is no problem that the block copolymer layer 14 is formed not only on the crevice S2 of the convexoconcave structure formed by the resist, but also on the salient S1 of the convexoconcave structure. S1 and S2 are each indicated in FIG. 4E Thereafter, the microphase-separated structure is formed in the block copolymer layer 14 to form a microphase-separated pattern of block copolymer 14a, 14b (FIG. 4G). For example, a lamellar phase in which the first block chain layer 14a and the second block chain layer 14b are orientated in a direction perpendicular to a surface of the substrate 11 is formed as shown in FIG. 4G. A cylinder structure which is oriented in a direction perpendicular to a surface of the substrate 11 can be also formed by the first block chain layer 14a and the second block chain layer 14b.

In this embodiment, it is preferred to remove a polymer that is not chemically bound to the thermally crosslinkable molecule from the polymer layer 13 after chemically binding the thermally crosslinkable molecule to the polymer, in other words, before forming a guide pattern. The block copolymer layer 14 can be more stably formed on the polymer layer 13 by removing the polymer that is not chemically bound to the thermally crosslinkable molecule.

In FIGS. 4C to 4H, the thickness of the polymer layer 13 is the same as that of FIG. 4B in order to simplify the description.

The film thickness of the polymer layer 13 is preferably greater than 1 nm and smaller than 10 nm. This is because if the film thickness is 1 nm or less, the surface energy state becomes unstable. On the other hand, if the film thickness is 10 nm or more, an aspect ratio of pattern after etching the block copolymer layer 14 and the polymer layer 17 becomes smaller and there is possibility not to function as a transfer film. The film thickness of the polymer layer 17 is more preferably from 2 to 10 nm, particularly preferably from 2 to 5 nm.

As shown in FIG. 4G, when it is intended to form a lamellar phase and a cylinder phase in which the first block chain layer 14a and the second block chain layer 14b are orientated in a direction perpendicular to a surface of the substrate 11, a material may be selected so that the surface energy of the polymer layer 13 is a state intermediate between the surface energy of the first block chain and the surface energy of the second block chain. An example satisfying such an energy relationship is that the polymer included in the polymer layer 13 is a random copolymer constituted of the polymer constituting the block copolymer in the block copolymer layer 14. A specific example is that the polymer layer 13 includes a random copolymer constituted of polystyrene (PS) and polymethylmethacrylate (PMMA) and the block copolymer layer 14 thereon includes a block copolymer constituted of PS and PMMA.

In cases other than the above case, the surface energy of the polymer layer 13 can be adjust to a state intermediate between the surface energy of the first block chain and the surface energy of the second block chain by appropriately selecting the materials used in the polymer layer 13 and the block copolymer layer 14. A specific example is that the polymer layer 13 includes a random copolymer constituted of polystyrene (PS) and polymethyl acrylate (PMA) and a block copolymer layer 14 thereon includes the block copolymer constituted of PS and polymethylmethacrylate (PMMA).

Figure 4H:
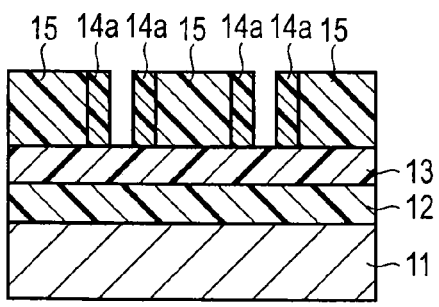

According to the second embodiment, a pattern finer than a resist pattern as a guide pattern can be formed by utilizing the microphase separation of the block copolymer. Therefore, a fine line and space pattern or a contact hole pattern which exceeds the resolution of energy rays used for irradiating to the resist can be formed by removing selectively one of phases forming the microphase-separated structure (here the second block chain layer 14*b*) after forming the microphase-separated structure (FIG. 4H). Furthermore, the remained phase (here the resist layer 15 and the first block chain layer 14*a*) can be used as a transfer film.

According to further embodiment, there is provided a laminate shown in FIG. 4B. A laminate shown in FIG. 4B includes a substrate; a thermally crosslinkable molecule layer stacked on the substrate and including a thermally crosslinkable molecule with a group that attaches to the substrate and a group that chemically binds to another material by heating; and a polymer layer which is staked on the thermally crosslinkable molecule layer and includes a polymer not having photosensitivity. Furthermore, there is provided a laminate further including a layer which is stacked on the polymer layer and includes a resist and a block copolymer.

EXAMPLES

Hereinafter, the embodiment of present invention will be described based on the examples.

Synthesis of Thermally Crosslinkable Molecule

Synthetic Example 1

4-hydroxybenzene sulfonyl chloride

Thionyl chloride (44.3 mL, 604 mmol, and 6.91 Eq) and N,N-dimethylformamide (DMF)(1 mL) were added to sodium 4-hydroxybenzenesulfonate (20.3 g, 87.2 mmol, and 1.00 Eq) under an argon atmosphere, and the mixture was stirred under reflux at 60° C. for 4 hours. The resultant mixture was cooled to room temperature and ice (160 g) was added thereto. The mixture was stirred and the water layer was extracted with dichloromethane (1×60 mL, 2×40 mL). The obtained organic layer was washed with ice water (40 mL) and dried with sodium sulfate. The solvent was removed by an evaporator and 4-hydroxybenzene sulfonyl chloride (10.4 g, 53.8 mmol, 62%) was obtained as oil.

Synthetic Example 2

4-hydroxybenzenesulfonyl azide 4-hydroxybenzene sulfonyl chloride synthesized in Synthetic example 1 (3.76 g, 19.5 mmol, and 1.00 Eq) was dissolved in acetone (50 mL) and then water (50 mL) was added thereto. The obtained mixed solution was cooled to 0° C. and NaN$_3$ (1.41 g, 21.7 mmol, and 1.11 Eq) was added to the solution slowly, followed by stirring at 0° C. for 1 hour. After the stirring, acetone was removed by the evaporator (30° C., 150 mbar) and a water layer was extracted with dichloromethane (3×30 mL). The obtained organic layer was dried with sodium sulfate and dichloromethane was removed by the evaporator. The product as oil (3.06 g, 15.4 mmol, and 79%) was dried in vacuo to obtain 4-hydroxybenzenesulfonyl azide.

Synthetic Example 3

Synthesis of 4-allyloxybenzenesulphonyl azide 4-hydroxybenzenesulfonyl azide synthesized in Synthetic example 2 (1.72 g, 8.63 mmol, and 1.00 Eq) was dissolved in DMF (17 mL), and then sodium hydroxide (354 mg, 8.85 mmol, and 1.03 Eq) and allylbromide (14.0 g, 116 mmol, and 13.4 Eq) were added thereto. The solution was stirred at room temperature for 16 hours and water (50 mL) was added thereto, followed by extraction with diethylether (3×20 mL). The obtained organic layer was dried with sodium sulfate and the organic solvent was removed by the evaporator (30° C.). The product was purified by column chromatography (hexane/ethyl acetate 10:1) to obtain 4-allyloxybenzenesulphonyl azide as pale yellow oil (0.89 g, and 32%).

Synthetic Example 4

4-(3'chlorodimethylsilyl)propyloxybenzenesulphonyl azide 4-allyloxybenzenesulphonyl azide synthesized in Synthetic example 4 was placed in a Schrenck tube and dimethylchlorosiliane (20 mL) and 10% Pt/C catalyst (10 mg) were added thereto under a nitrogen atmosphere. The mixed solution was refluxed at 40° C. for 5 hours. Thereafter, 10% Pt/C catalyst was removed by using a filter, the unreacted dimethylchlorosilane was removed in vacuo, and 4-(3'chlorodimethylsilyl)propyloxybenzenesulphonyl azide (CSBSA) was obtained.

Synthetic Example of Polymer Used in Photosensitive Composition Layer

As the polymer used in the photosensitive composition layer, a random copolymer (PS-r-PtBA) of polystyrene (PS) and poly(tert-butyl acrylate) (PtBA) was synthesized as follows.

The PS-r-PtBA was synthesized by the radical polymerization method. Styrene monomer (0.012 mol), tert-butyl acrylate monomer (0.036 mol), and azobisisobutyronitrile (0.00024 mol) were dissolved in dehydrated tetrahydrofuran. Separately, a radical polymerization is conducted by using only a monomer and an initiator without using a dehydrated tetrahydrofuran. The reaction vessel was substituted by nitrogen and stirred at 60° C. for 40 hours. The obtained solution was concentrated by the evaporator and reprecipitated with methanol and pure water. After the reprecipitation, the resultant product was dried in vacuo at 60° C. to obtain PS-r-PtBA. The molecular weight was evaluated by gel permeation chromatography (LC-10A, manufactured by Shimadzu Corporation). The volume fractions of PS and PtBA were evaluated using a thermogravimetric/differential thermal simultaneous analyzer (TG/DTA6200, manufactured by Seiko Instruments Inc.) and 1-H-NMR (JEOL Instrument at 270 MHz, GSX-270). When the polymerization is conducted by using a dehydrated tetrahydrofuran, the number average molecular weight (Mn) was 11800 and the volume fractions of PS and PtBA were 25 mol % and 75 mol %, respectively. When the polymerization is conducted without a dehydrated tetrahydrofuran, the number average molecular weight (Mn) was 220000 and the volume fractions of PS and PtBA were 25 mol % and 75 mol %, respectively.

Test Example 1

Confirmation Whether Chemical Bond is Formed or not

A toluene solution (0.03 M, 1 mL) of 4-(3'chloro dimethylsilyl)propyloxybenzenesulphonyl azide (CSBSA) dropped on a silicon wafer and a toluene solution (0.2 M, 1 mL) of triethylamine was continuously dropped thereon. The resultant silicon wafer was left undisturbed for 1 minute. The solution was shaken off by rotating the silicon wafer. Thereafter, the whole surface was rinsed with toluene, methanol, and acetone, and a thermally crosslinkable molecule layer containing CSBSA was formed on the silicon wafer. Subsequently, a solution of polystyrene in propylene glycol monomethyl ether acetate (PGMEA) (1 wt %) was prepared. As the polystyrene, P8096-S, P8007-S, and P1071-St obtained from Polymer Source, Inc. were used. As for P8096-S, a number average molecular weight (Mn) is 8000 and a degree of dispersion (Mw/Mn) is 1.07. As for P8007-5, the number average molecular weight (Mn) is 30000 and the degree of dispersion (Mw/Mn) is 1.04. As for P1071-St, the number average molecular weight (Mn) is 115900 and the degree of dispersion (Mw/Mn) is 1.10. Subsequently, each polystyrene is applied onto the thermally crosslinkable molecule layer containing CSBSA at a rate of rotation of 2500 rpm. Each of the polystyrene films was annealed at 180° C. for 2 hours. After annealing, each polystyrene film was rinsed with cyclohexanone for 15 minutes. After rinsing each film, the contact angle of water as well as the film thickness of each polystyrene film were evaluated. From the result of the contact angle of water, the contact angles of the polystyrene films were 80° (P8096-S), 93° (P8007-S), and 94° (P1071-St), respectively. The film thickness of the polystyrene films were evaluated with an atomic force microscope (Nanoscope III). The film thickness were 2.35 nm (P8096-S), 6.34 nm (P8007-S), and 9.31 nm (P1071-St), respectively. It was found that the film thickness corresponded to the radius of gyration and it was equivalent to the thickness of about one molecule of polystyrene. The radius of gyration (Rg) was determined from the following equation.

$$Rg = 0.0275 \sqrt{Mw}$$

wherein Mw represents a weight average molecular weight. The film thickness can be controlled by changing the molecular weight of the polymer to be chemically bound to the thermally crosslinkable molecule. From the result above, it can be confirmed that the chemical bond was formed between CSBSA and polystyrene.

Test Example 2

Change in Surface Energy by Irradiation with Energy Rays

Various kinds of PS-r-PtBA films having different volume fractions of PtBA were prepared. The contact angle of water on the surface of the PS-r-PtBA film before and after UV irradiation was evaluated. The fact that the contact angle of the waterdrop becomes large means that the surface energy of the film becomes low, namely, it is made hydrophobic. On the other hand, the fact that the contact angle becomes small means that the surface energy of the film becomes high, namely, it is made hydrophilic.

PS-r-PtBA prepared by changing the volume fraction of PtBA from 40 to 90 mol % was dissolved in propylene glycol monomethyl ether acetate (PGMEA). Further, 1 wt % of TPS-105 (Midori Kagaku Co., Ltd.), i.e., a photo-acid generator (PAG), was added to the resultant solution. A silicon substrate after the UV-cleaning was spin-coated with the solution at a rate of rotation of 1500 rpm to form a PS-r-PtBA film containing TPS-105. Thereafter, the PS-r-PtBA film was irradiated with a low pressure mercury lamp for 1 minute and baked at 180° C. for 90 seconds. Separately, an unexposed sample was also prepared. The contact angle of water on the surface of the unexposed PS-r-PtBA film was evaluated. As a result, it was confirmed that when the volume fraction of PtBA was changed from 40 to 90 mol %, the contact angle of water could be controlled in a range of 91.4 to 81°. On the other hand, the contact angle of water on the surface of the exposed PS-r-PtBA film was evaluated. As a result, it was confirmed that when the volume fraction of PtBA was changed from 40 to 90 mol %, the contact angle of water could be controlled in a range of 71.4 to 10°. As the above result, it can be confirmed that a pattern of a hydrophobic portion and a hydrophilic portion can be formed by forming the pattern of the unexposed portion and the exposed portion on the PS-r-PtBA film. It can be confirmed that the degree of hydrophobicity and hydrophilicity can be controlled by changing the condition of irradiation with energy rays, baking conditions, and the volume fraction of PS and PtBA in the PS-r-PtBA.

Test Example 3

Change in Surface Energy by Irradiation with Energy Rays after Chemically Binding A toluene solution (0.03 M, 1 mL) of CSBSA was applied to a silicon wafer and a toluene solution (0.2 M, 1 mL) in triethylamine was applied thereto. The resultant silicon wafer was left alone for 1 minute. The solution was shaken off by rotating the silicon wafer. Thereafter, the whole surface was rinsed with toluene, methanol, and acetone, and then a thermal crosslinking molecular layer containing CSBSA was formed on the silicon wafer.

Subsequently, a solution containing a random copolymer (PS-r-PtBA) constituted of polystyrene (PS) and poly(tert-butyl acrylate) (PtBA) and a photo-acid generator (TPS-105) was prepared. This solution was prepared by dissolving PS-r-PtBA and TPS-105 in PGMEA so that the concentration of PS-r-PtBA was 1 wt %. The concentration of TPS-105 to be added to PS-r-PtBA was 5 wt %. The PS-r-PtBA was synthesized by radical polymerization and the weight average molecular weight (Mw) is from 347000 to 594000. The molar fraction (f(PtBA)) of PtBA is from 0.75 to 0.90.

Subsequently, the solution was applied to the thermally crosslinkable molecule layer at a rate of rotation of 2500 rpm. The resultant product was baked at 110° C. for 90 seconds after the coating to form a photosensitive composition layer containing TPS-105 and PS-r-PtBA. Then, the substrate in which the thermally crosslinkable molecule layer and the photosensitive composition layer were formed was annealed at 200° C. for 1 minute to thermally cross-link CSBSA with PS-r-PtBA. Then, the PS-r-PtBA film was irradiated with UV rays for 5 minutes using a low pressure mercury lamp. After UV irradiation, the resultant film was post-exposure baked at 180° C. for 90 seconds and rinsed with cyclohexanone for 5 minutes.

After rinsing the film, the contact angle of water was evaluated. As a result, the contact angle of the PS-r-PtBA film was from 66.8 to 35.5°. The contact angle of the PS-r-PtBA film before exposure was from 86.5 to 85.8°. Therefore, the surface energy of PS-r-PtBA is changed by cross-linking CSBSA with PS-r-PtBA followed by irradiating the PS-r-PtBA film with energy rays. After rinsing the film, the film thickness of PS-r-PtBA was evaluated. The atomic force microscope (Nanoscope III) was used to evaluate the film thickness. The film thickness of PS-r-PtBA was from 4.28 to 6.08 nm. From the above result, it is found that the thermal crosslinking molecule can be cross-linked with PS-r-PtBA in a short time and the surface energy of the PS-r-PtBA film can be easily controlled.

Test Example 4

Patterning by Irradiating with Energy Rays

A PS-r-PtBA film was formed by pattern-exposure by a KrF excimer laser. A toluene solution (0.03 M, 1 mL) of CSBSA was applied to a silicon wafer and a toluene solution (0.2 M, 1 mL) of triethylamine was applied thereto. The resultant silicon wafer was left alone for 1 minute. The solution was shaken off by rotating the silicon wafer. Thereafter, the whole surface was rinsed with toluene, methanol, and acetone, and then a thermal crosslinking molecular layer containing CSBSA was formed on the silicon wafer. Subsequently, a solution containing a random copolymer (PS-r-PtBA) constituted of polystyrene (PS) and poly(tert-butyl acrylate)(PtBA) and a photo-acid generator (TPS-105) was prepared. This solution was prepared by dissolving PS-r-PtBA and TPS-105 in PGMEA so that the concentration of PS-r-PtBA was 1 wt %. The concentration of TPS-105 to be added to PS-r-PtBA was 5 wt %. The PS-r-PtBA was synthesized by radical polymerization and the weight average molecular weight (Mw) is from 347000 to 594000. The molar fraction (f(PtBA)) of PtBA is from 0.75 to 0.90. Subsequently, the solution was applied to the thermally crosslinkable molecule layer at a rate of rotation of 2500 rpm. The resultant product was baked at 110° C. for 90 seconds after the coating to form a photosensitive composition layer containing TPS-105 and PS-r-PtBA. Then, the substrate in which the thermally crosslinkable molecule layer and the photosensitive composition layer were formed was annealed at 200° C. for 1 minute to thermally cross-link CSBSA with PS-r-PtBA. Subsequently, the PS-r-PtBA film was pattern-exposed by irradiating with a KrF excimer laser. The exposure amount was in the range of 1 to 103 mJ/cm$^2$. After the exposure, the resultant film was post-exposure baked at 180° C. for 90 seconds and the PS-r-PtBA film was rinsed with cyclohexanone for 5 minutes. After rinsing the film, the surface of the PS-r-PtBA film was evaluated with an atomic force microscope (Nanoscope III). The pattern formation of the PS-r-PtBA film was evaluated from the obtained shape image. It was confirmed that a line and space pattern with a half pitch of 1 μm to 200 nm was formed at an exposure amount of 91 mJ/cm$^2$.

Example 1

A toluene solution (0.03 M, 1 mL) of 4-(3'chloro dimethylsilyl)propyloxybenzenesulphonyl azide (CSBSA) synthesized in Synthetic example 4 dropped on a silicon wafer and a toluene solution (0.2 M, 1 mL) of triethylamine was continuously dropped thereon. The resultant silicon wafer was left undisturbed for 1 minute. The solution was shaken off by rotating the silicon wafer. Thereafter, the whole surface was rinsed with toluene, methanol, and acetone, and then a thermally crosslinkable molecule layer containing CSBSA was formed on the silicon wafer. Subsequently, a solution containing a random copolymer (PS-r-PtBA) constituted of polystyrene (PS) and poly(tert-butyl acrylate) (PtBA) and a photo-acid generator (TPS-105) was prepared. This solution was prepared by dissolving PS-r-PtBA and TPS-105 in propylene glycol monomethyl ether acetate (PGMEA) so that the concentration of PS-r-PtBA was 0.3 wt %. The PS-r-PtBA was synthesized by radical polymerization and the weight average molecular weight (Mw) is 50000. Subsequently, the solution was applied to the thermally crosslinkable molecule layer at a rate of rotation of 3000 rpm. The resultant product was baked at 110° C. for 90 seconds after the coating to form a photosensitive composition layer containing TPS-105 and PS-r-PtBA was formed.

Subsequently, the substrate on which the thermally crosslinkable molecule layer and the photosensitive composition layer were formed in the above manner was annealed at 200° C. for 1 minutes to bond chemically (cross-link) CSBSA with PS-r-PtBA. Then, the photosensitive composition layer is selectively modified by irradiating with an ArF excimer laser to form a pattern including the exposed portion and the unexposed portion which surface energies are different from each other. The pattern formed by irradiating with energy rays is a pattern for forming a lamellar phase in which layers of the first and second block chains are alternately stacked in parallel to the substrate and the exposed portion and the unexposed portion are arranged in parallel to each other. The half pitch of the pattern formed by irradiating with energy rays is 100 nm and 75 nm.

Separately, a solution of block copolymer is prepared. As the block copolymer, P189-SMMA obtained from Polymer Source, Inc., is used. The P189-SMMA is a block copolymer (PS-b-PMMA) constituted of polystyrene (PS) and polymethylmethacrylate (PMMA). As for the P189-SMMA, the number average molecular weight (Mn) of PS and PMMA blocks is 86500. A degree of dispersion (Mw/Mn) is 1.08. The volume fraction (f(PS)) of PS is 0.54.

The solution of P189-SMMA in PGMEA is prepared at a concentration of 2.0 wt % and spin-coated on the photosensitive composition layer at a rate of rotation of 2000 rpm. The resultant substrate is baked on a hot plate at 110° C. for 90 seconds to form a block copolymer layer.

Subsequently, microphase separation is caused in the block copolymer layer by annealing under a nitrogen atmosphere. Each region (2000 nm×2000 nm (2000 nm□)) on the surface of the block copolymer layer in each sample was observed with the atomic force microscope (Nanoscope III). Each observed region was measured in a tapping mode using a silicon chip [NCH-10T] as a cantilever. The orientation of block copolymers was evaluated from the obtained phase image.

A microphase-separated pattern of block copolymer is a lamellar phase with a half pitch of 25 nm. Since the guide pattern formed by irradiating with energy rays had a half pitch of 100 nm and 75 nm, the pattern formed by using the microphase separation of the block copolymer was finer than the guide pattern.

Example 2

Example 2 is conducted in the same manner as in Example 1 except that PS-r-PtBA which is not bound to CSBSA is removed after binding chemically CSBSA to PS-r-PtBA. The thickness of the photosensitive composition layer is 6.14 nm same as Example 1. The obtained pattern is same as Example 4.

Thus, a stable pattern with fewer defects can be obtained by removing the unreacted photosensitive composition.

Example 3

Example 3 is conducted in the same manner as in Example 1 except that PS-r-PtBA which is not bound to CSBSA is removed after irradiating with an ArF excimer laser. As a solvent for removing the unreacted PS-r-PtBA, cyclohexanone is used. The thickness of the photosensitive composition is 6.14 nm same as Example 1. The obtained pattern is same as Example 1.

Thus, a stable pattern with few defects can be obtained by removing the unreacted photosensitive composition.

Example 4

Example 4 is conducted in the same manner as in Example 1 except that 4-(3'dimethoxymethylsilyl)propylbenzenesulfonyl azide, 4-(3'trimethoxysilyl)propyloxybenzenesulphonyl azide, 4-(3'triethoxysilyl)propyloxybenzenesulphonyl azide or 4-(3'diethoxymethylsilyl)propylbenzenesulfonyl azide is used in place of CSBSA. In each case, the obtained pattern is same as Example 1.

Example 5

Example 5 is conducted in the same manner as Example 1 except that 1-azide-8-propyltrimethoxysilane, 1-azide-8-propyltriethoxysilane, 1-azide-8-propylchlorodimethylsilane, 1-azide-8-octyltrimethoxysilane, 1-azide-8-octyltriethoxysilane or 1-azide-8-octylchlorodimethylsilane is used in place of CSBSA. In each case, the obtained pattern is the same as that of Example 1.

Example 6

Example 6 is conducted in the same manner as in Example 1 except that a layer including gold, silver, copper or platinum was formed on a silicon wafer and 4-(propylthiol)benzenesulphonyl azide or 4-(propyloxythiol)benzenesulphonyl azide, 1-azide-3-propylthiol or 1-azide-8-octylthiol is used in place of CSBSA. In each case, the obtained pattern is same as Example 1.

Example 7

Example 7 is conducted in the same manner as Example 1 except that an oxide film including $SiO_2$, $Al_2O_3$, $ZrO_2$, or $TiO_2$ is formed on a silicon wafer, and 4-(propanehosphonate)benzenesulphonyl azide, 4-(butanephosphonate)benzenesulphonyl azide, 4-(propyloxyphosphonate)benzenesulphonyl azide, 4-(butoxyphosphonate)benzenesulphonyl azide, 1-azide-3-propanephosphonate, 1-azide-4-butylphosphonate or 1-azide-8-octanephosphonate is used in place of CSBSA. In each case, the obtained pattern is the same as that of Example 1.

Example 8

Example 8 is conducted in the same manner as Example 1 except that random block copolymer including polystyrene, poly(tert-butylacrylate) and polyacrylate is used as the random copolymer. The obtained pattern is the same as that of Example 1.

Example 9

Example 9 is conducted in the same manner as in Example 1 except that a block copolymer including polystyrene and poly(n-propyl methacrylate), a block copolymer including polystyrene and poly(n-butyl methacrylate), a block copolymer including polystyrene and poly(n-hexyl methacrylate), a block copolymer including polystyrene and polylactide, and polymethylmethacrylate and polyhedral oligomeric silsesquioxane is used. In any case where each of the block copolymers is used, the microphase separated pattern of block copolymer is a lamellar phase with a half pitch of 25 nm.

Example 10

A toluene solution (0.03 M, 1 mL) of 4-(3'chloro dimethylsilyl)propyloxybenzenesulphonyl azide (CSBSA) synthesized in Synthetic example 4 dropped on a silicon wafer and a toluene solution (0.2 M, 1 mL) of triethylamine was continuously dropped thereon. The resultant silicon wafer was left undisturbed for 1 minute. The solution was shaken off by rotating the silicon wafer. Thereafter, the whole surface was rinsed with toluene, methanol, and acetone, and then a thermally crosslinkable molecule layer containing CSBSA was formed on the silicon wafer. Subsequently, the formed layer was spin-coated with a solution of a random copolymer (PS-r-PMMA) constituted of polystyrene (PS) and polymethylmethacrylate (PMMA). The PS-r-PMMA solution was dissolved in propylene glycol monomethyl ether acetate (PGMEA) at a concentration of 0.3 wt % and the layer was spin-coated with the solution at a rate of rotation of 3000 rpm. As the PS-r-PMMA, P9225-SMMAran obtained from Polymer Source, Inc., was used. As for the P9225-SMMAran, the number average molecular weight (Mn) is 7000, the degree of dispersion (Mw/Mn) is 1.20, and the volume fraction (f(PS)) of PS is 0.63. Thereafter, CSBSA was cross-linked with PS-r-PMMA by annealing at 200° C. for 10 minutes. Subsequently, a photoresist (AM2073J; JSR Co., Ltd.) is applied to the PS-r-PMMA layer and the resultant layer is irradiated with an ArF excimer laser. A contact hole pattern with a hole diameter of 90 nm is transferred to the photoresist by pattern exposure. The exposure amount is 42 $mJ/cm^2$. After the exposure, the film is developed in 2.38% tetramethylammonium hydroxide aqueous solution (AD-10), obtained from Tama Chemicals Co., Ltd., to obtain a contact hole pattern with a hole diameter of 70 nm (1:1). The patternized photoresist film is baked at 185° C. for 2 minutes to be cured. The photoresist becomes insoluble in PGMEA by this process.

Separately, a solution of block copolymer was prepared. As the block copolymer, P2400-SMMA obtained from Polymer Source, Inc., was used. The P2400-SMMA is a block copolymer of a polystyrene (PS) block and a polymethylmethacrylate (PMMA) block. The number average molecular weight (Mn) of the PS and PMMA blocks is 67100. A degree of dispersion (Mw/Mn) is 1.09. The volume fraction (f(PS)) of PS is 0.69.

The PGMEA solution of P2400-SMMA is prepared at a concentration of 2.0 wt % and the pattern of photoresist is spin-coated with the solution at a rate of rotation of 2000 rpm. The resultant substrate is baked on a hot plate at 110° C. for 90 seconds to for a block copolymer layer.

Subsequently, the microphase separation of the block copolymers is caused by annealing in a nitrogen atmosphere. Each region (2000 nm×2000 nm) on each sample surface is observed with an atomic force microscope (Nanoscope III). Each observed region is measured in a tapping mode using a silicon chip [NCH-10T] as a cantilever. The orientation of block copolymer is evaluated from the obtained phase image.

The phase separation pattern of block copolymer has a cylinder-like structure with a hole diameter of 25 nm. Since the resist pattern produced as a guide pattern has a hole diameter of 75 nm, a contact hole pattern smaller than the resist pattern can be formed using the phase separation of block copolymer.

Example 11

Example 11 is conducted in the same manner as in Example 10 except that CSBSA is thermally cross-linked with PS-r-PMMA and the uncross-linked PS-r-PMMA is removed. As a solvent for removing the unreacted PS-r-PMMA, cyclohexanone is used. The obtained pattern is the same as that of Example 10.

Thus, a stable pattern with few defects can be obtained by removing the unreacted polymer.

Example 12

Example 12 is conducted in the same manner as in Example 10 or 11 except that 4-(3'dimethoxymethylsilyl) propylbenzenesulfonyl azide, 4-(3'trimethoxysilyl)propyloxybenzenesulphonyl azide, 4-(3'triethoxysilyl)propyloxybenzenesulphonyl azide or 4-(3'diethoxymethylsilyl) propylbenzenesulfonyl azide is used in place of CSBSA. In each case, the obtained pattern is same as Example 10 or 11.

Example 13

Example 13 is conducted in the same manner as Example 10 or 11 except that 1-azide-8-propyltrimethoxysilane, 1-azide-8-propyltriethoxysilane, 1-azide-8-propylchlorodimethylsilane, 1-azide-8-octyltrimethoxysilane, 1-azide-8-octyltriethoxysilane or 1-azide-8-octylchlorodimethylsilane is used in place of CSBSA. In each case, the obtained pattern is the same as that of Example 10 or 11.

Example 14

Example 14 is conducted in the same manner as in Example 10 or 11 except that a layer including gold, silver, copper or platinum was formed on a silicon wafer and 4-(propylthiol)benzenesulphonyl azide or 4-(propyloxythiol)benzenesulphonyl azide, 1-azide-3-propylthiol or 1-azide-8-octylthiol is used in place of CSBSA. In each case, the obtained pattern is same as Example 10 or 11.

Example 15

Example 15 is conducted in the same manner as Example 10 or 11 except that an oxide film including $SiO_2$, $Al_2O_3$, $ZrO_2$, or $TiO_2$ is formed on a silicon wafer, and 4-(propanehosphonate)benzenesulphonyl azide, 4-(butanephosphonate) benzenesulphonyl azide, 4-(propyloxyphosphonate)benzenesulphonyl azide, 4-(butoxyphosphonate) benzenesulphonyl azide, 1-azide-3-propanephosphonate, 1-azide-4-butylphosphonate or 1-azide-8-octanephosphonate is used in place of CSBSA. In each case, the obtained pattern is the same as that of Example 10 or 11.

According to the embodiment or the examples, it is possible to provide a method which can easily control the orientation of block copolymer and form a fine pattern in a short time in the patterning method using the microphase separation of block copolymer.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of forming a pattern, comprising:
   forming a thermally crosslinkable molecule layer including a thermally crosslinkable molecule on a substrate, the thermally crosslinkable molecule having a group that attaches to the substrate and a group that chemically binds to another material by heating;
   forming a photosensitive composition layer including a photosensitive composition on the thermally crosslinkable molecule layer, the photosensitive composition layer having a surface energy which is changed by irradiation with energy rays;
   chemically binding the thermally crosslinkable molecule to the photosensitive composition by heating;
   selectively irradiating the photosensitive composition layer with energy rays;
   forming a block copolymer layer including a block copolymer on the photosensitive composition layer; and
   forming a microphase-separated structure in the block copolymer layer.

2. The method according to claim 1, further comprising:
   removing the photosensitive composition which is not chemically bound to the thermally crosslinkable molecule from the photosensitive composition layer after binding chemically the thermally crosslinkable molecule to the photosensitive composition and before irradiating the photosensitive composition layer with energy rays.

3. The method according to claim 1, further comprising removing the photosensitive composition which is not chemically bound to the thermally crosslinkable molecule from the photosensitive composition layer after irradiating the photosensitive composition layer with energy rays and before forming the block copolymer layer.

4. The method according to claim 1, wherein a film thickness of the photosensitive composition layer is greater than 1 nm and smaller than 10 nm.

5. The method according to claim 1, further comprising:
   selectively removing one of phases forming the microphase-separated structure after forming the microphase-separated structure; and
   using a remained phase as a transfer film.

6. The method according to claim 1, wherein the thermally crosslinkable molecule has a silanol group, an alkoxy silyl group, a chlorosilyl group, a phosphonate group, a selenide group, a telluride group, a sulfide group, a disulfide group, a thiol group, an isocyanate group, a bromide group, a carbonyl group, or a hydroxyl group at one end, and has an azide group at the other end.

7. The method according to claim 1, wherein the thermally crosslinkable molecule is represented by a general formula (I) below:

$$z\text{-}X\text{—}Y \qquad (I)$$

wherein
Z represents a silanol group, an alkoxy silyl group, a chlorosilyl group, a phosphonate group, a selenide group, a telluride group, a sulfide group, a disulfide group, a thiol group, an isocyanate group, a bromide group, a carbonyl group or a hydroxyl group;
X represents an alkylene group or a combination group of an alkylene group and an ether linkage; and
Y represents an azido group or a benzenesulphonyl azido group.

8. The method according to claim 7, wherein the thermally crosslinkable molecule is represented by a general formula (Ib) below:

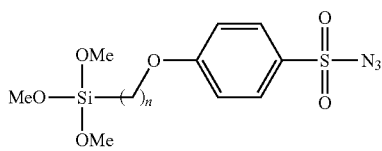

(Ib)

wherein
Me represents a methyl group; and
n represents an integer of 1 to 12.

9. The method according to claim 7, wherein the thermally crosslinkable molecule is represented by a general formula (IIb) below:

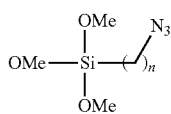

(IIb)

wherein
Me represents a methyl group; and
n represents an integer of 1 to 12.

10. The method according to claim 7, wherein the thermally crosslinkable molecule is represented by a general formula (IIIa) below:

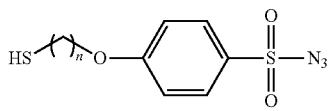

(IIIa)

wherein n represents an integer of 1 to 12.

11. The method according to claim 7, wherein the thermally crosslinkable molecule is represented by a general formula (IVa) below:

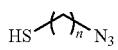

(IVa)

wherein n represents an integer of 1 to 12.

12. The method according to claim 7, wherein the thermally crosslinkable molecule is represented by a general formula (Va) below:

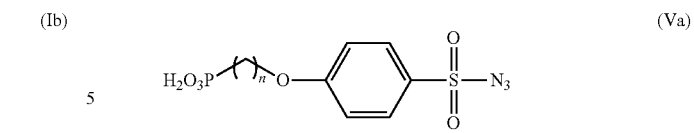

(Va)

wherein n represents an integer of 1 to 12.

13. The method according to claim 7, wherein the thermally crosslinkable molecule is represented by following Formula (VIa):

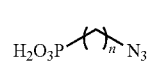

(VIa)

wherein n represents an integer of 1 to 12.

14. A method of forming a pattern, comprising:
forming a thermally crosslinkable molecule layer on the substrate, the thermally crosslinkable molecule layer including a thermally crosslinkable molecule with a group that attaches to a substrate and a group that chemically binds to another material by heating;
forming a polymer layer including a polymer not having photosensitivity on the thermally crosslinkable molecule layer;
chemically binding the thermally crosslinkable molecule to the polymer by heating;
removing the polymer which is not chemically bound to the thermally crosslinkable molecule from the polymer layer;
forming a resist layer on the polymer layer;
selectively irradiating the resist layer with energy rays;
developing the resist layer to form a convexoconcave structure;
forming a block polymer layer including a block copolymer on a crevice of the convexoconcave structure; and
forming a microphase-separated structure in the block copolymer layer.

15. The method according to claim 14, wherein a film thickness of the polymer layer is greater than 1 nm and smaller than 10 nm.

16. The method according to claim 14, further comprising:
selectively removing one of phases forming the microphase-separated structure after forming the microphase-separated structure; and
using a remained phase as a transfer film.

* * * * *